(12) United States Patent
Yu

(10) Patent No.: US 6,626,691 B2
(45) Date of Patent: Sep. 30, 2003

(54) PICK UP CAP FOR BGA SOCKET

(75) Inventor: Hung-Chi Yu, Tu-Chen (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 10/028,640

(22) Filed: Dec. 19, 2001

(65) Prior Publication Data

US 2003/0114036 A1 Jun. 19, 2003

(51) Int. Cl.⁷ .............................................. H01R 13/625
(52) U.S. Cl. ........................ 439/342; 439/135; 439/940
(58) Field of Search ................................. 439/342, 135, 439/940, 330, 331, 70–73

(56) References Cited

U.S. PATENT DOCUMENTS

| | | | | | |
|---|---|---|---|---|---|
| 5,147,209 A | * | 9/1992 | Litwin et al. | ............... | 439/931 |
| 5,879,169 A | * | 3/1999 | Wu | ............... | 439/940 |
| 6,146,155 A | * | 11/2000 | Boling et al. | ............... | 439/940 |
| 6,155,848 A | * | 12/2000 | Lin | ............... | 439/135 |
| 6,231,367 B1 | * | 5/2001 | Hsiao et al. | ............... | 439/342 |

* cited by examiner

Primary Examiner—Hien Vu
(74) Attorney, Agent, or Firm—Wei Te Chung

(57) ABSTRACT

A Zero Insertion Force (ZIF) Ball Grid Array (BGA) socket assembly (1) comprises a base (10) defining a plurality of passageways (13) therein, a cover (20) slidably mounted on the base and defining a plurality of holes (23) in alignment with corresponding passageways, and a pick up cap (40, 40', 40") fixed on the cover. The pick up cap includes a top plate (42, 42', 42") disposed on the cover, and a plurality of latch arms (44, 44', 44") downwardly and inwardly extending from opposite ends of the top plate for fixing the pick up cap on the cover.

1 Claim, 6 Drawing Sheets

PICK UP CAP FOR BGA SOCKET

BACKGROUND OF THE INVENTION

1. Field of the Invention

The present invention relates to a ZIF (Zero Insertion Force) BGA (Ball Grid Array) socket assembly, and particularly to a ZIF BGA socket assembly having a pick up cap for suction by a vacuum pick up device.

2. Description of Related Art

With the development of Surface Mount Technology (SMT), ZIF BGA sockets, which have solder balls, find widespread application in computers and other electronic devices for transmitting signals and conducting current between a printed circuit board (usually called a motherboard) and an IC (Integrated Circuit) package. A ZIF BGA socket typically comprises a base having a plurality of passageways vertically extending therethrough, a cover movably mounted on the base, and a plurality of terminals received in the passageways of the base. Each terminal includes a mating portion received in a corresponding passageway, and a solder ball projecting beyond a bottom face of the base for electrical connection with the printed circuit board. The cover defines a plurality of holes in alignment with the corresponding passageways allowing downwardly extending pins of the IC package to extend therethrough to engage with the mating portions of the terminals. Therefore, an electrical connection between the IC package and the printed circuit board is established.

The BGA socket is generally soldered to solder pads of the printed circuit board prior to the assembly of the IC package. Due to the shape of the solder balls of the terminals, the BGA socket can not be pre-disposed on the printed circuit board by an operator before soldering. Accordingly, before the soldering process, the BGA socket must be disposed on the solder pads of the printed circuit board via a vacuum pick up device. However, the BGA socket defines an opening in a middle section for dissipating heat, so the vacuum pick up device can not directly suck the BGA socket. This problem needs to be solved.

Hence, a BGA socket assembly having a pick up cap for suction by a vacuum pick up device is required to overcome the disadvantages of the related art.

SUMMARY OF THE INVENTION

Accordingly, the main object of the present invention is to provide a ZIF BGA socket assembly having a pick up cap for facilitating suction by a vacuum pick up device, thereby facilitating soldering the BGA socket to a printed circuit board.

In order to achieve the object set forth, a ZIF BGA socket having a pick up cap in accordance with the present invention comprises a base defining a plurality of passageways therein, a cover slidably attached on the base and defining a plurality of holes in alignment with the corresponding passageways, and a pick up cap fixed on the cover. The pick up cap includes a top plate disposed on the cover, and a plurality of latch arms downwardly extending from opposite ends of the top plate for fixing the pick up cap on the cover.

Other objects, advantages and novel features of the invention will become more apparent from the following detailed description when taken in conjunction with the accompanying drawings.

DETAILED DESCRIPTION OF THE INVENTION

Figure 1:
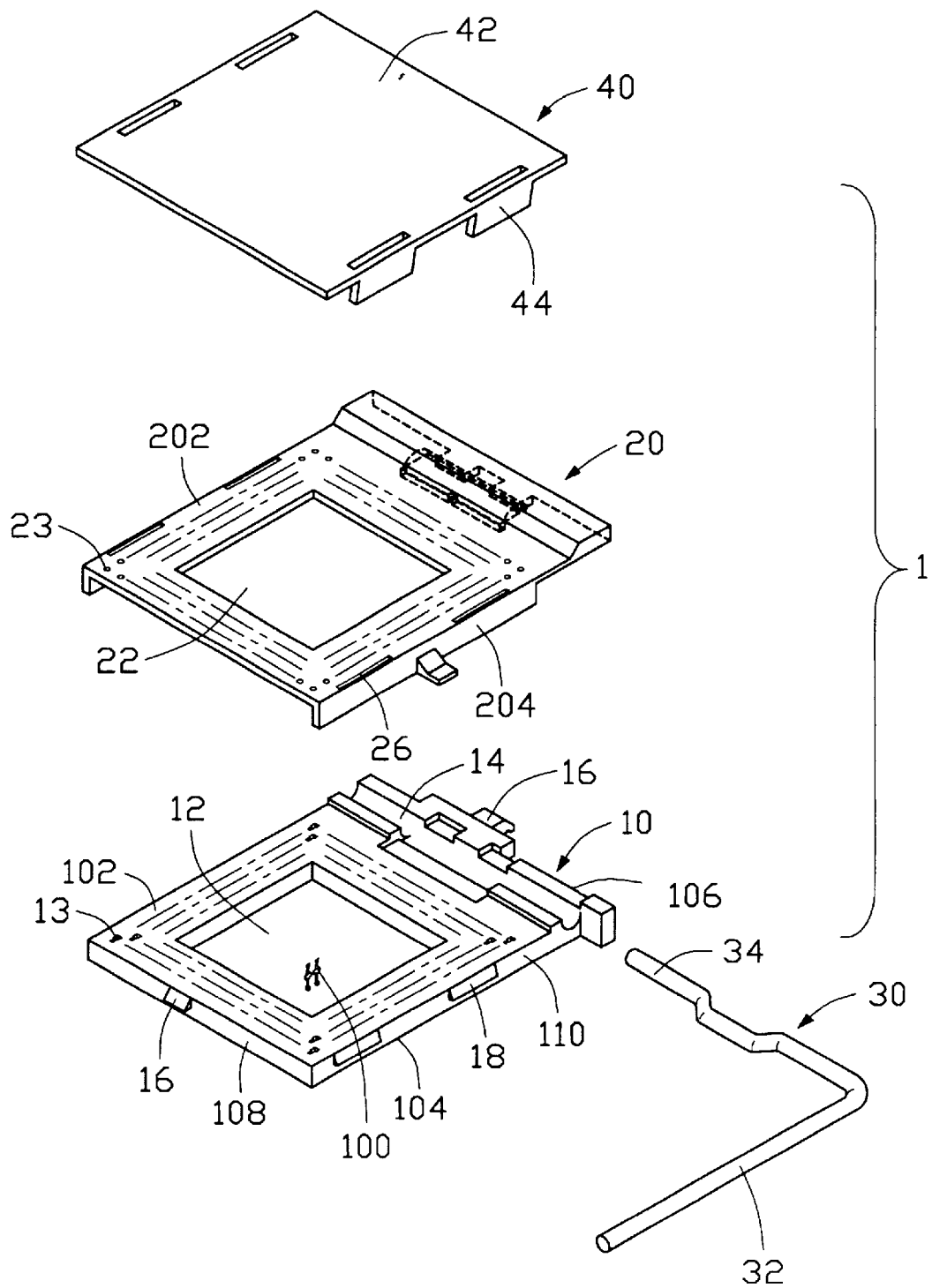
FIG. 1 is an exploded, perspective view of a ZIF BGA socket assembly having a pick up cap in accordance with a first embodiment of the present invention.
Figure 2:
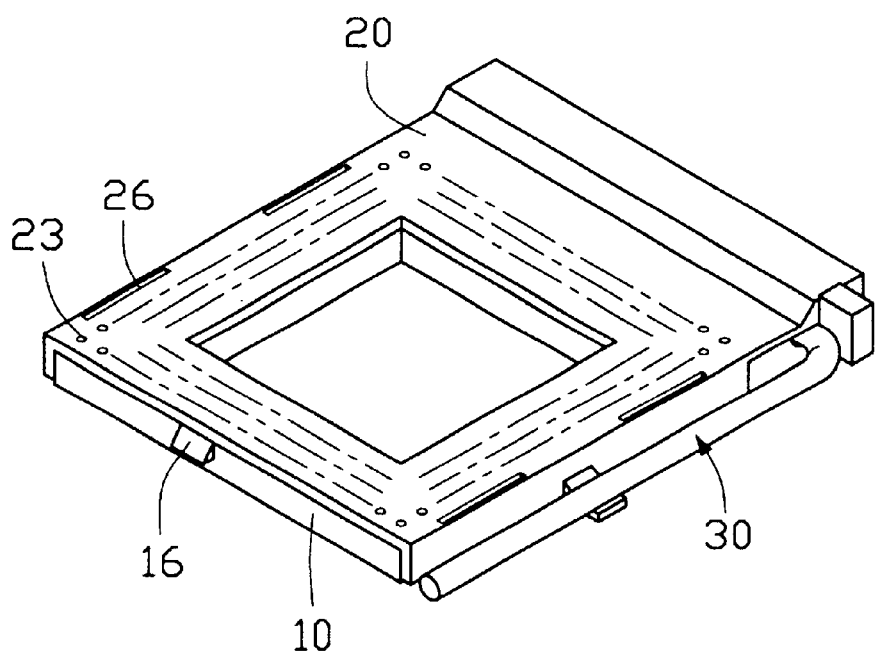
FIG. 2 is an assembled view of the BGA socket assembly in FIG. 1 with the pick up cap removed therefrom.

Referring to FIGS. 1 and 2, a ZIF BGA socket assembly 1 having a pick up cap 40 in accordance with a first embodiment of the present invention comprises a base 10, a cover 20 slidably mounted on the base 10, a lever 30 sandwiched between the base 10 and the cover 20, and a pick up cap 40 fixed on the cover 20.

The base 10 is generally of a rectangular configuration and defines a first opening 12 in a middle section for dissipating heat. The base 10 defines a plurality of passageways 13 vertically extending through a top and a bottom faces 102, 104 for receiving a plurality of terminals 100 therein. Each terminal 100 includes a mating portion (not labeled) received in a corresponding passageway 13 of the base 10, and a solder ball (not labeled) projecting beyond the bottom face 104 of the base 10. A channel 14 is defined in the base 10 along a lateral direction and adjacent to a rear face 106 of the base 10. The base 10 has a pair of heat sink ears 16 respectively formed on a front face 108 and the rear face 106, and a plurality of projections 18 formed on opposite side faces 110.

The cover 20 includes a body portion 202, and a pair of side walls 204 downwardly extending from opposite ends of the body portion 202. The body portion 202 defines a second opening 22 corresponding to the first opening 12, and a plurality of holes 23 in alignment with the passageways 13 for allowing downwardly extending pins of an IC package (not shown) to extend therethrough to engage with the mating portions of the terminals 100. The cover 20 defines a plurality of slots 26 at conjunction of the body portion 202 and the side walls 204. The side walls 204 have a corresponding number of protrusions (not shown) formed on inside faces thereof for engaging with the projections 18 of the base 10.

The lever 30 sandwiched between the base 10 and the cover 20 includes an operating handle 32 exposed to and accessible from outside and a cam shaft 34 received in the channel 14, whereby when the operating handle 32 is rotated from a horizontal position to a vertical position, the cover 20 can be slidably moved with regard to the base 10 in a front-to-rear direction.

Figure 3:
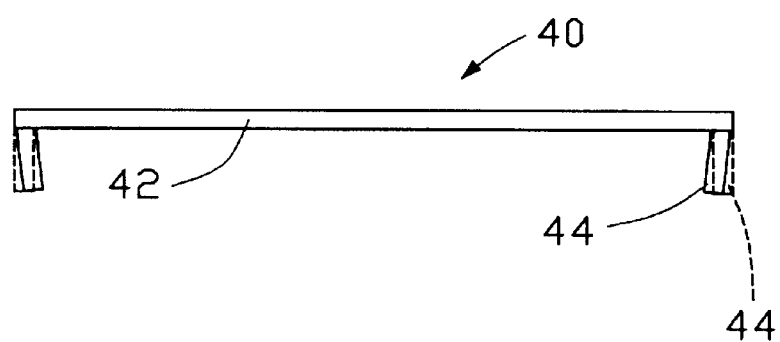
FIG. 3 is a front, plan view of the pick up cap of FIG. 1 showing latch arms thereof in original (solid lines) and final (dashed lines) positions.

Referring to FIG. 3, the pick up cap 40 made from plastic material includes a rectangular top plate 42 and a plurality of latch arms 44 (as shown in solid lines) downwardly and inwardly extending from opposite ends of the top plate 42 along a lateral direction. The width of the top plate 42 is slightly larger than that of the base 10.

Referring to FIG. 2, in assembly, the cover 20 is movably mounted on the base 10 with the lever 30 sandwiched therebetween. The protrusions of the cover 20 interfere with the projections 18 located on the opposite side faces 110 of the base 10. The body portion 202 of the cover 20 lies on the top face 102 of the base 10. The side walls 204 of the cover 20 are disposed along the side faces 110 of the base 10.

Figure 4:
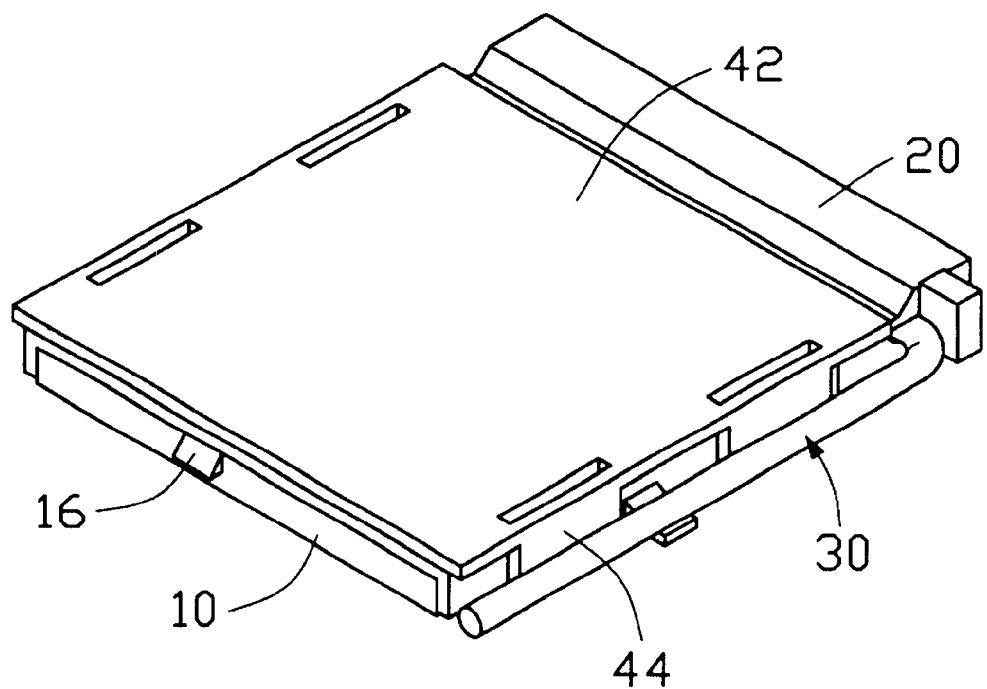
FIG. 4 is a perspective view showing the pick up cap of FIG. 1 assembled on the socket.

Referring to FIG. 4, when the pick up cap 40 is assembled to the cover 20 of the BGA socket, the top plate 42 is disposed on the body portion 202. The latch arms 44 of the pick up cap 40 deflect outwardly to arrive at a final position (best shown in dashed lines of FIG. 3) and resiliently abut against the side walls 204 of the cover 20, whereby the pick up cap 40 is reliably fixed on the cover 20.

Figure 5:
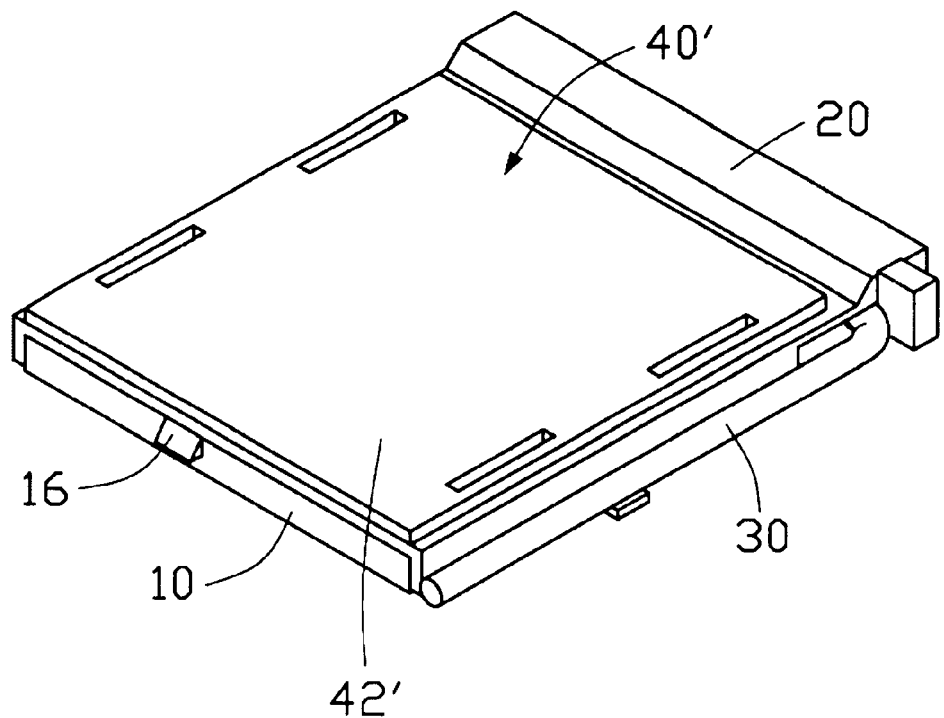
FIG. 5 is a perspective view showing a pick up cap assembled on the socket in accordance with a second embodiment of the present invention.

FIG. 5 shows a pick up cap 40' in accordance with a second embodiment of the present invention. The pick up cap 40' has a configuration substantially the same as that of the pick up cap 40, except for the slightly smaller width of the top plate 42'. When the pick up cap 40' is assembled to the cover 20, the latch arms 44 deflect outwardly to be received and retained in the slots 26 of the cover 20, whereby the pick up cap 40' is also reliably fixed on the cover 20.

Figure 6:
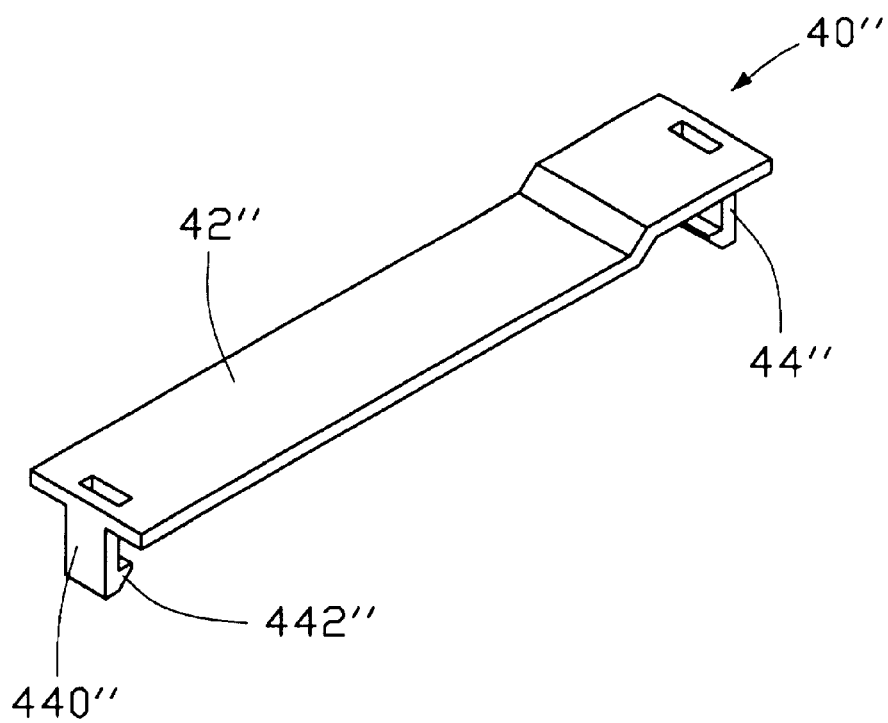
FIG. 6 is a perspective view of a pick up cap for the socket in accordance with a third embodiment of the present invention.
Figure 7:
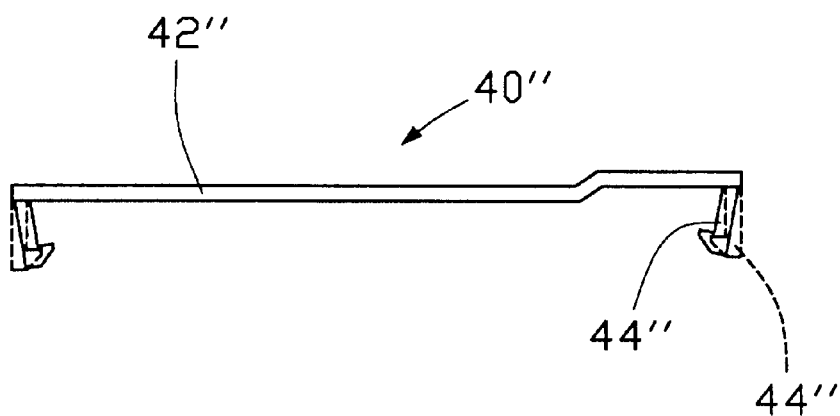
FIG. 7 is a front, plan view of the pick up cap of FIG. 6 showing latch arms thereof in original (solid lines) and final (dashed lines) positions.
Figure 8:
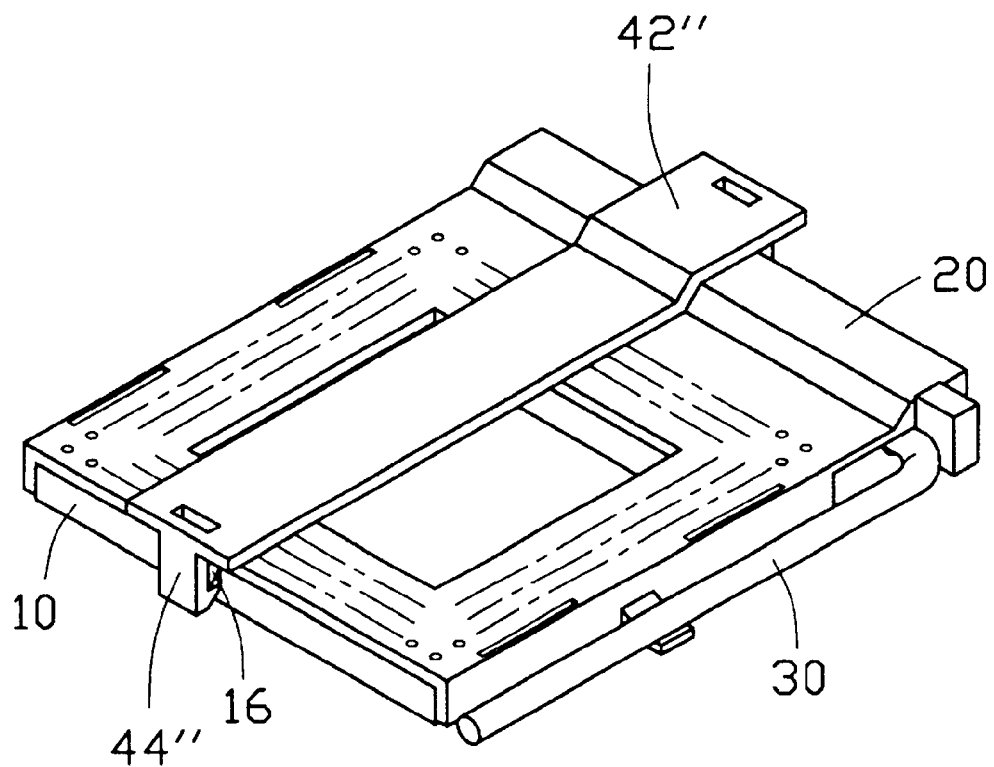
FIG. 8 is a perspective view showing the pick up cap of FIG. 6 assembled on the socket.

Referring to FIGS. 6, 7 and 8, a pick up cap 40" is shown in accordance with a third embodiment of the present invention. The pick up cap 40" made from plastic material includes an elongated top plate 42" and a pair of hooked latch arms 44" downwardly and inwardly extending from opposite ends of the top plate 42" in a lengthwise direction. The length of the top plate 42" is slightly larger than that of the base 10. Each latch arm 44" has a vertical portion 440" integrally extending from the top plate 42", and a hook portion 442" extending inwardly and upwardly from a bottom edge of the vertical portion 440". When the pick up cap 40" is assembled to the cover 20, the top plate 42" is disposed on the top face 202 of the cover 20. The latch arms 44" deflect outwardly to resiliently engage with the heat sink ears 16 of the base 10 by latching the hook portions 442" on the hear sink ears 16, thereby fixedly mounting the pick up cap 40" on the cover 20.

Before the solder balls of the terminals 100 of the BGA socket 1 are soldered to solder pads of a printed circuit board (not shown), a vacuum pick up device (not shown) is provided for picking up the BGA socket 1. After the solder pads are printed with solder pastes, the vacuum pick up device directly sucks the pick up cap 40 (40', 40") of the BGA socket 1 to properly position the solder balls of the terminals 100 on the solder pads. Therefore, after a reflow process, the BGA socket 1 is reliably and electrically connected with the printed circuit board.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A ball grid array socket assembly, comprising:

a base defining a plurality of passageways therein and having at least a heat sink ear at one end of the base;

a plurality of terminals received in the passageways;

a cover movably mounted on the base and defining a plurality of holes in alignment with corresponding passageways;

a lever including a cam shaft for actuating the cover to move relative to the base and an operation handle connected with the cam shaft rotating between a vertical position and a horizontal position;

a pick up cap having a top plate disposed on the cover and a plurality of downwardly extending latch arms for fixing the pick up cap on the cover;

wherein the cover comprises a pair of opposite side walls, and the latch arms downwardly and inwardly extend from opposite ends of the top plate to resiliently abut against said side walls of the cover; and wherein one of the latch arms is snugly sandwiched between the operation handle and one side wall of the cover when the operation handle is in the horizontal position.

* * * * *